United States Patent
Maki (10) Patent No.: US 7,421,364 B2
(45) Date of Patent: Sep. 2, 2008

(54) INTEGRATED CIRCUIT DEVICE HAVING A TEST CIRCUIT TO MEASURE AC CHARACTERISTICS OF INTERNAL MEMORY MACRO

(75) Inventor: Yasuhiko Maki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/335,697

(22) Filed: Jan. 20, 2006

(65) Prior Publication Data

US 2006/0126412 A1 Jun. 15, 2006

Related U.S. Application Data

(63) Continuation of application No. PCT/JP03/09231, filed on Jul. 22, 2003.

(51) Int. Cl.
*G01R 31/00* (2006.01)
*G01R 31/14* (2006.01)

(52) U.S. Cl. .................... 702/117; 702/118

(58) Field of Classification Search ............ 702/89, 702/117–121, 125, 176
See application file for complete search history.

(56) References Cited

U.S. PATENT DOCUMENTS 3,805,152 A 4/1974 Ebersman et al.
4,332,028 A 5/1982 Joccotton et al.
5,585,754 A * 12/1996 Yamashina et al. ......... 327/158
2007/0086232 A1 * 4/2007 Joshi et al. ................. 365/154

FOREIGN PATENT DOCUMENTS

| JP | 62-120698 A | 6/1987 |
|----|-------------|--------|
| JP | 64-0641999 A | 3/1989 |
| JP | 02-264878 A | 10/1990 |
| JP | 03-030200 A | 2/1991 |
| JP | 04-247400 A | 9/1992 |
| JP | 06-075022 A | 3/1994 |
| JP | 09-091995 A | 4/1997 |
| JP | 11-297097 A | 10/1999 |
| JP | 2002-042466 A | 2/2002 |
| WO | 2005/008677 | * 1/2005 |

* cited by examiner

*Primary Examiner*—Michael P Nghiem
(74) *Attorney, Agent, or Firm*—Arent Fox, LLP (57) ABSTRACT

An integrated circuit device of the invention, has a memory macro which during normal operation latches an input address in response to a control pulse and generates data output corresponding to the input address, and a test control circuit 22 which during testing performs memory macro characteristic tests. A ring oscillator is configured by connecting a prescribed number of stages including one or more memory macro units, having a memory macro and a pulse generation circuit which during testing generates a control pulse for tests in response to an input pulse, and the test control circuit measures the oscillation frequency or period of the ring oscillator.

18 Claims, 13 Drawing Sheets

INTEGRATED CIRCUIT DEVICE HAVING A TEST CIRCUIT TO MEASURE AC CHARACTERISTICS OF INTERNAL MEMORY MACRO

CROSS-REFERENCE TO RELATED APPLICATIONS

This application is a continuation of international application PCT/JP03/09231, filed on Jul. 22, 2003, now pending, herein incorporated by reference.

TECHNICAL FIELD

The present invention relates to an integrated circuit device having a test circuit to measure the AC characteristics of an internal memory macro, and in particular relates to an integrated circuit device having a test circuit which raises the measurement precision of the RAM macro access time, and is capable of measuring the clock width of the control clock and characteristic values for the setup time and hold time of the control clock.

BACKGROUND ART

An integrated circuit device such as an ASIC device, which incorporates RAM or other memory macros in addition to logic circuitry, is required to test the access time and other AC characteristics of an internal RAM macro with good precision. Because these measurements are performed using external testing equipment, it has been proposed that flip-flops be placed in the input stage and output stage of a RAM macro, so that a control clock pulse is input to the RAM macro from the input stage flip-flop in response to a first clock pulse, and that the output from the RAM macro be captured by the output stage flip-flop on the second control clock pulse.

Figure 1:
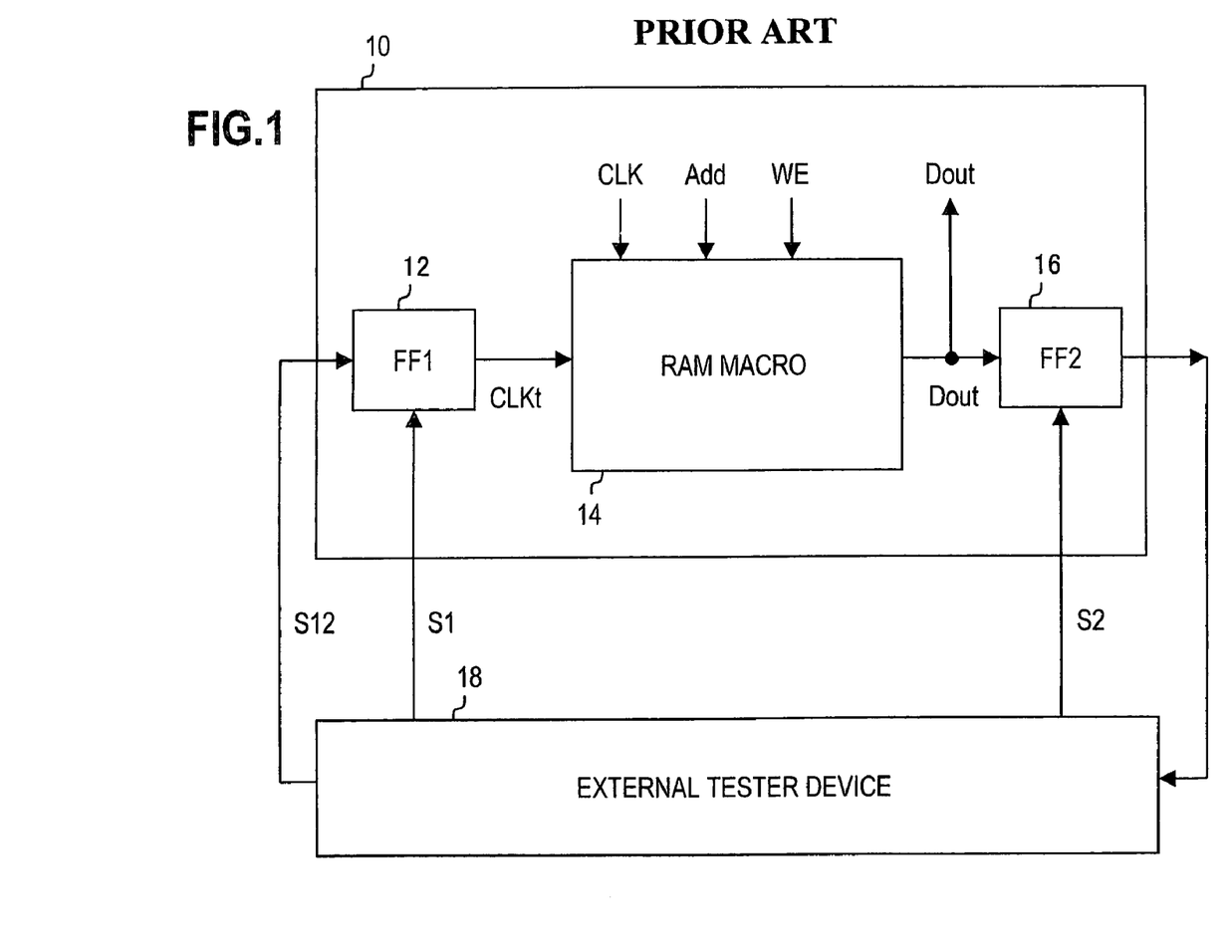
FIG. 1 shows a method of RAM macro measurement of the prior art.

FIG. 1 shows a method of the prior art for RAM macro measurement. A first flip-flop 12 is provided in the input stage of the RAM macro 14 incorporated into the integrated circuit device 10, and a second flip-flop 16 is provided in the output stage; an input signal S12 from an external testing device 18 is captured by the first flip-flop 12 with the timing of the first clock S1, and a control clock pulse CLKt is input to the RAM macro 14. Further, the RAM macro data output Dout is captured by the second flip-flop 16 with the timing of a second clock S2 and is supplied to the external testing device 18. By varying the timing of the second clock S2 with reference to the first clock S1 to determine the timing at which the correct data output Dout can be obtained, the access time of the RAM macro 14 is measured.

A RAM macro begins a read operation in sync with the control clock CLKt, and after a prescribed access time outputs the read-out data output Dout. By selecting the address Add such that the read-out data changes from H level to L level, or from L level to H level, the output timing of the data output Dout can be detected.

Further, in for example Japanese Patent Laid-open No. 2001-208804, a technique is proposed in which a circuit which generates the above first clock Si and second clock S2 is incorporated within the integrated circuit device, and similar measurements are performed while modifying the timing of the second clock S2 through an incorporated variable delay control circuit.

However, when using the method of measuring the time delay between flip-flops provided before and after the RAM macro, due to such factors as the precision with which the test device control clocks Si and S2 are generated, the difference in delay times of the flip-flops corresponding to the control clocks Si, S2, and the precision of operation of the flip-flops themselves, an error of order several hundreds of picoseconds occurs in the measured value. The access time for SRAM and other high-speed RAM may for example be 1 nsec or so, and so the above measurement error is too large to be ignored.

Hence an object of this invention is to provide an integrated circuit device having an internal test circuit capable of performing precise measurements of the AC characteristics of an internal RAM macro.

A further object of this invention is to provide an integrated circuit device having an internal test circuit capable of precise measurement of the clock access time of internal RAM, and of precise measurement of the pulse width of control pulses (or of the control clock) and of the characteristic values of the setup time and hold time for control pulses (or the control clock).

DISCLOSURE OF THE INVENTION

A first aspect of the invention is an integrated circuit device, having a memory macro which during normal operation latches an input address in response to a control pulse and generates data output corresponding to the input address, and a test control circuit which during testing performs memory macro characteristic tests. A ring oscillator is configured by connecting a prescribed number of stages comprising one or more memory macro units, having a memory macro and a pulse generation circuit which during testing generates a control pulse for tests in response to an input pulse; and the test control circuit measures the oscillation frequency or period of the ring oscillator.

According to the first aspect, data output of the memory macro is supplied to a later-stage pulse generation circuit to generate a control pulse, so that a ring oscillator comprising the memory macro undergoes oscillation. By dividing the oscillation period by a prescribed number of stages, and excluding the delay time of the pulse generation circuit, the memory macro access time can be precisely measured.

In a preferred embodiment of the above first aspect of the invention, the pulse width of the pulse generation circuit can be variably controlled, and the ring oscillator oscillation state is monitored while variably controlling the control pulse width. By this means, the limit value of the control pulse width can be measured.

In another preferred embodiment of the above first aspect of the invention, a oscillation pulse in the ring oscillator is provided, via a prescribed delay time of a variable delay circuit, as a test address for the memory macro. Through variable control of the delay time of this variable delay circuit, the limit values of the setup time and hold time of the memory macro can be measured.

BEST MODE FOR CARRYING OUT THE INVENTION

Below, embodiments of the invention are explained referring to the drawings.

Figure 2:
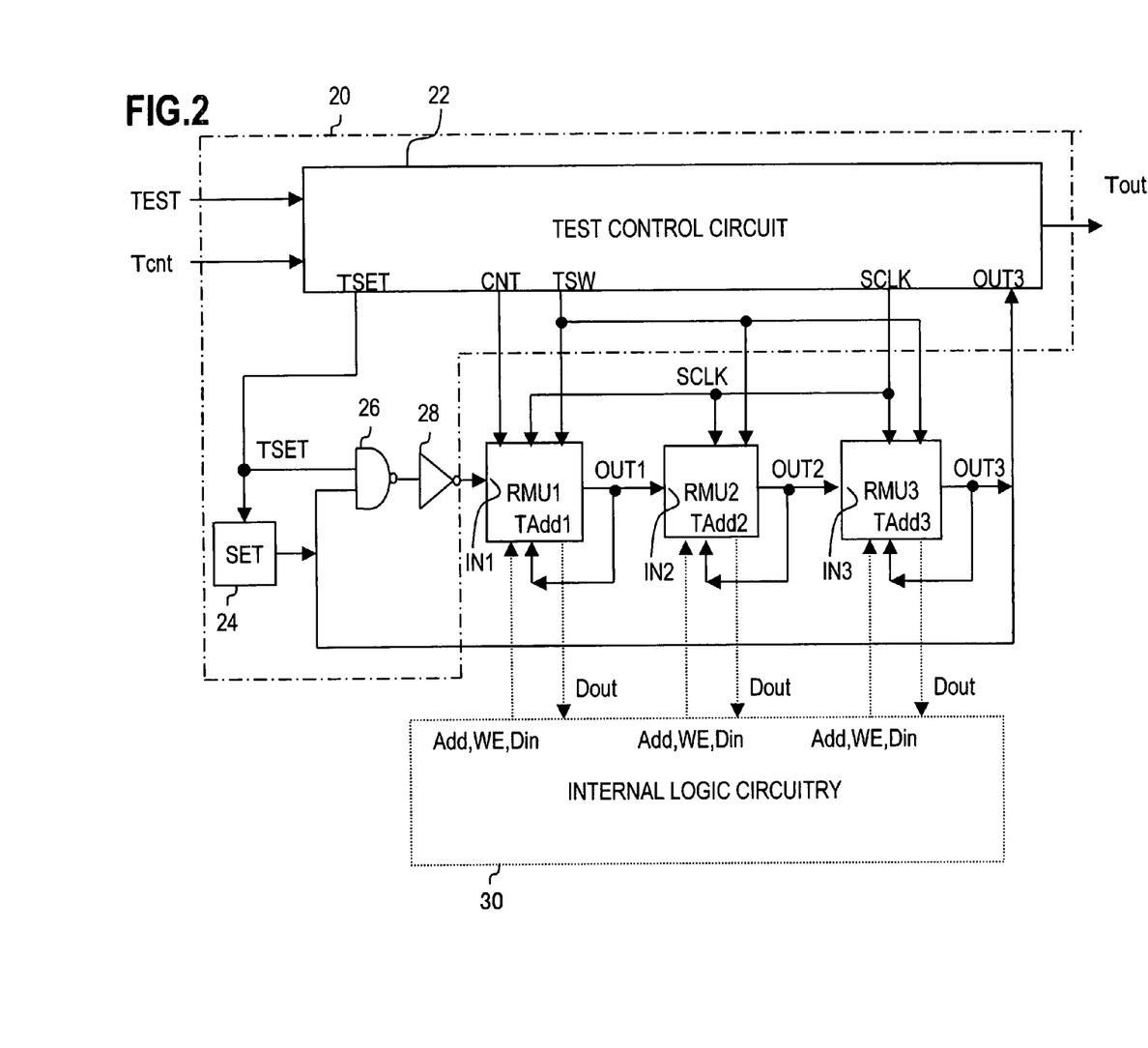
FIG. 2 shows the configuration of an integrated circuit device incorporating a test circuit of one aspect.

FIG. 2 shows the configuration of an integrated circuit device 20 incorporating a test circuit in an embodiment of the invention. This integrated circuit 20 device is provided with a memory macro, such as for example a RAM macro (not shown), in addition to the internal logic circuitry 30. The outputs OUT1, 2, 3 of the RAM macro units RMU1, 2, 3 having internal RAM macros are connected to inputs IN2, 3, 1 of later-stage RAM macro unit, in a cascade connection, and the output OUT3 of the RAM macro unit RMU3 in the final stage is fed back to the input IN1 of the initial-stage RAM macro unit RMU1 via a NAND gate 26 and inverter 28, to form a ring oscillator.

Figure 3:
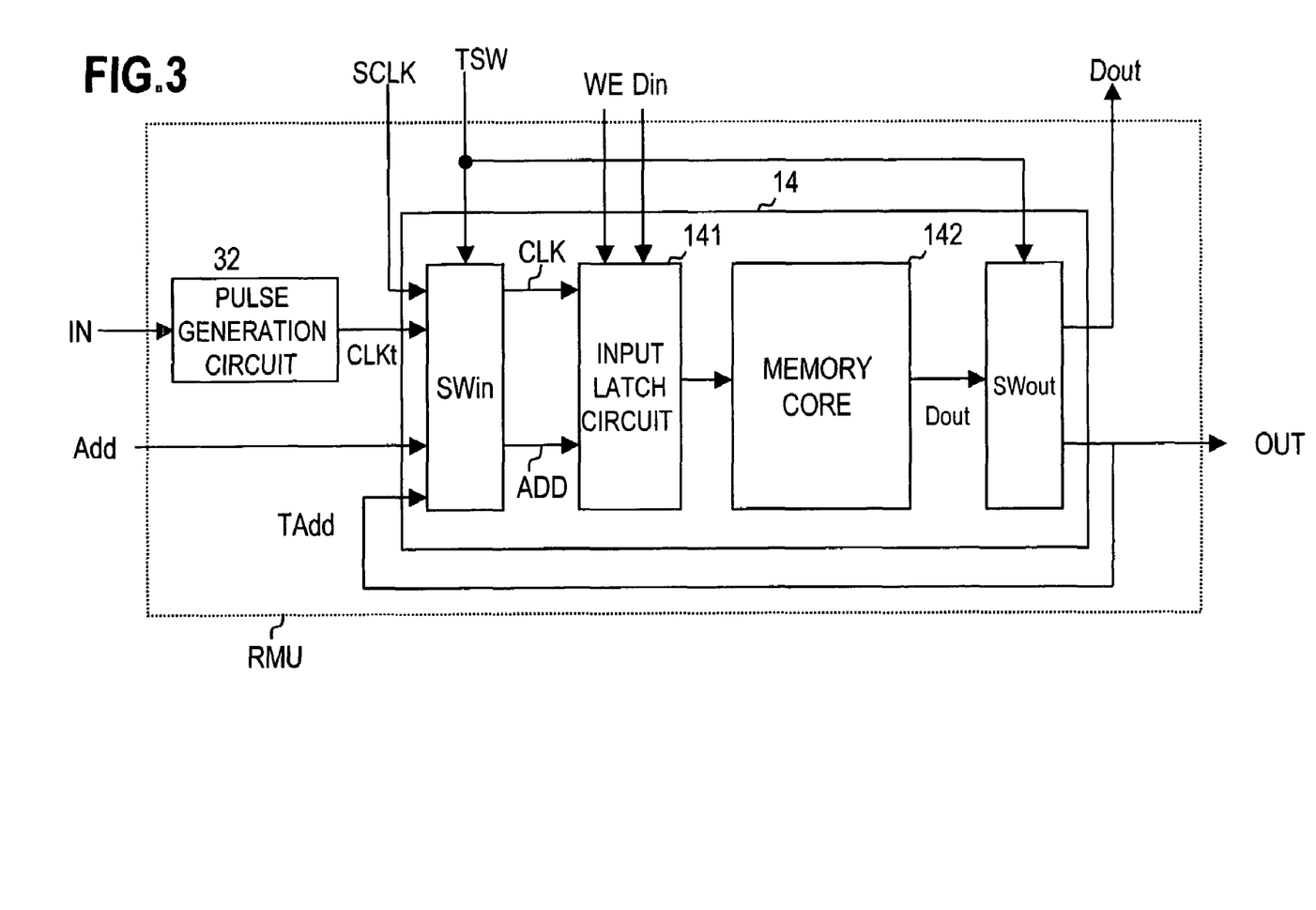
FIG. 3 shows the configuration of a RAM macro unit RMU having a RAM macro.

FIG. 3 shows the configuration of a RAM macro unit RMU having a RAM macro. The RAM macro 14 has an input latch circuit 141, which inputs the address ADD, data input Din and write enable WE in response to the control clock CLK which is the control pulse, and a memory core 142 having, at least, a decoder, memory cell array, and output circuit; the RAM macro 14 outputs the read-out data Dout. The RAM macro unit RMU has, in addition to the RAM macro 14, a pulse generation circuit 32 which generates a control pulse CLKt for testing. This pulse generation circuit 32 generates a control pulse CLKt for testing in response to both the leading edge and the trailing edge of an input pulse IN.

Further, within the RAM macro 14 are provided an input-side switch circuit SWin and an output-side switch circuit SWout. During normal operation, these switch circuits supply the address signal Add and system clock SCLK to the input latch circuit 141 as the address signal ADD and control clock CLK, and output the data output Dout. On the other hand, during testing the switch circuit SWin inputs the test control pulse CLKt generated by the pulse generation circuit 32 as the control clock CLK, and the switch circuit SWout outputs the read-out data output Dout as the RAM macro unit data output pulse OUT. The data output pulse OUT is supplied to the input latch circuit 141, via the input-side switch circuit SWin, as a test address bit TAdd comprised by a portion of the address signal ADD. The switch circuits SWin and SWout are switched during normal operation and during testing by the test switching signal TSW.

H level data corresponding to a first address (TAdd=L level), and L level data corresponding to a second address (TAdd=H level), are written to the memory core 142. Hence during testing the data output Dout is fed back as the test address TAdd, so that each time a test control clock pulse CLKt is supplied the output data output Dout repeatedly alternates between H level and L level. That is, when a test control pulse CLKt is supplied in the data output Dout=TAdd=L level state, the corresponding first address data output Dout=H level is supplied. Then, when a test control pulse CLKt is supplied thereafter, the data output corresponding to the second address Dout=L level is output.

Figure 4:
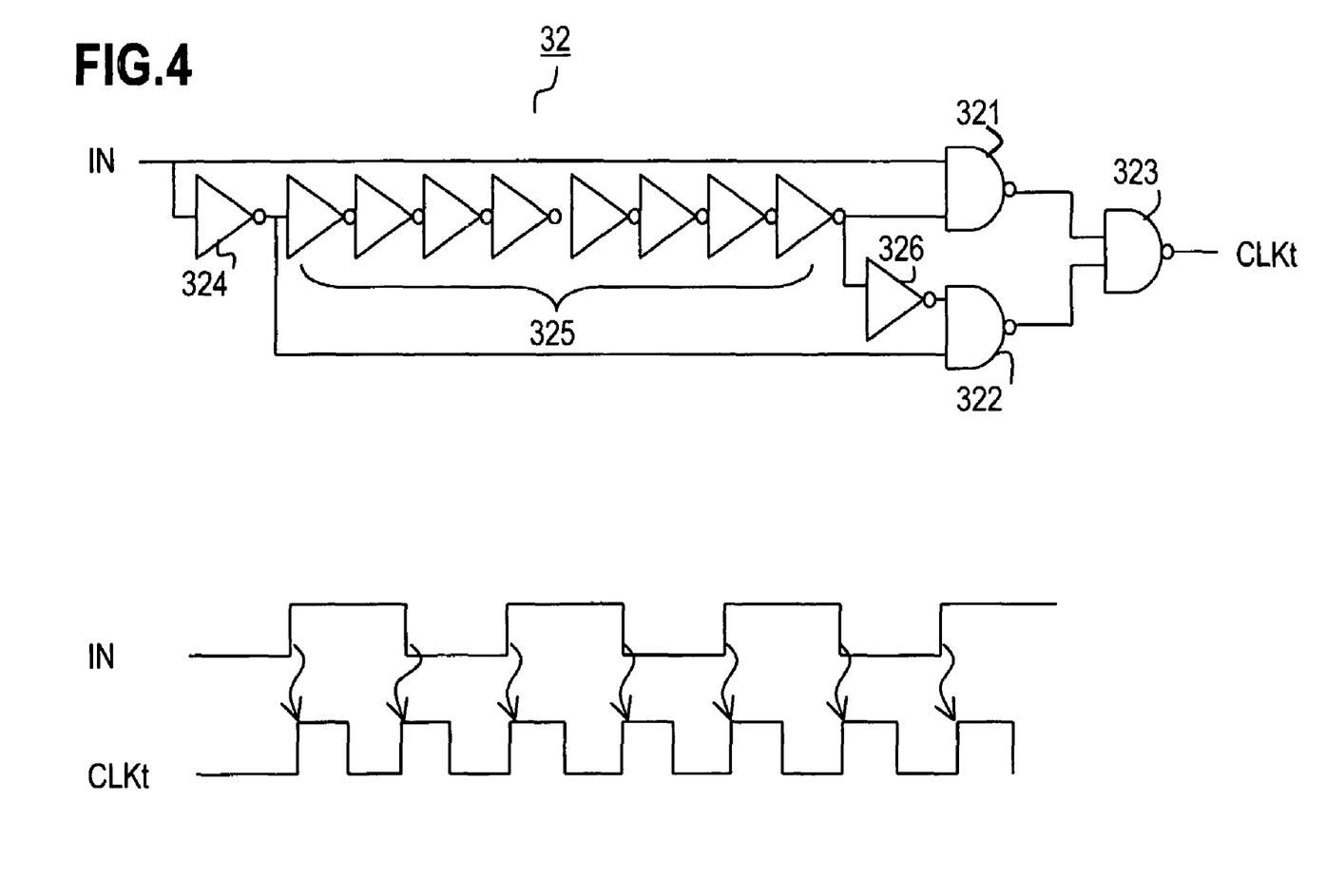
FIG. 4 shows the configuration and operating waveforms of the pulse generation circuit 32.

FIG. 4 shows the configuration and operating waveforms of the pulse generation circuit 32. The pulse generation circuit 32 comprises NAND gates 321, 322, 323, inverters 324, 326, and an even number of inverter stages in series 325. A pulse signal is generated in response to the leading edge of an input pulse IN by the inverter 324 and inverter series 325 and the NAND gate 321, and a pulse signal is generated in response to the trailing edge of an input pulse IN (that is, the leading edge of the output of the inverter 324) by the inverter series 325 and inverter 326 and the NAND gate 322.

In the state in which the input IN is at L level, the output of the even number of inverter stages in series 325 is at H level, and at the instant that the input IN goes to H level at the rising edge of the input pulse, the output from the NAND gate 321 goes to L level. The output from the inverter series 325 then changes to L level after the delay time of the inverter 324 and inverter series 325 has elapsed, and the output of the NAND gate 321 returns to H level. That is, a negative pulse is generated in the output of the NAND gate 321, in response to the leading edge of the input pulse IN. At this time, the output of the NAND gate 322 is fixed at H level, so that the negative pulse from the NAND gate 321 is inverted by and passes through the NAND gate 323, to generate a test control pulse CLKt.

At the trailing edge of the input pulse IN, conversely to the above, a negative pulse is generated in the output of the NAND gate 322 due to the inverter series 325, the inverter 326, and the NAND gate 322, and this negative pulse is inverted and passes through the NAND gate 323 to generate the test a control pulse CLKt. As a result, as shown in FIG. 4, the test control pulses CLKt are generated in response to the leading edges and trailing edges of the input pulse IN.

Returning to FIG. 2, as explained above, H level data corresponding to the first address (TAdd=L level) is written, and L level data corresponding to the second address (TAdd=H level) is written, to the memory core in the RAM macro units RMU1, 2, 3. Further, control pulses CLKt are generated, in response to both the leading edges and the trailing edges of input pulses IN, to control the internal RAM macros, and data output Dout is output. Hence during testing, the RAM macro units RMU1, 2, 3 each begin RAM macro read operations in response to both edges of input pulses IN, and outputs OUT1, 2, 3 are caused to change in alternation between H level and L level. Consequently the three RAM macro units RMU1, 2, 3 are cascade-connected, and the output OUT3 of the final-stage unit RMU3 is connected so as to be fed back to the initial stage, so that a ring oscillator is configured from the RAM macro units.

RAM Macro Access Time

Figure 5:
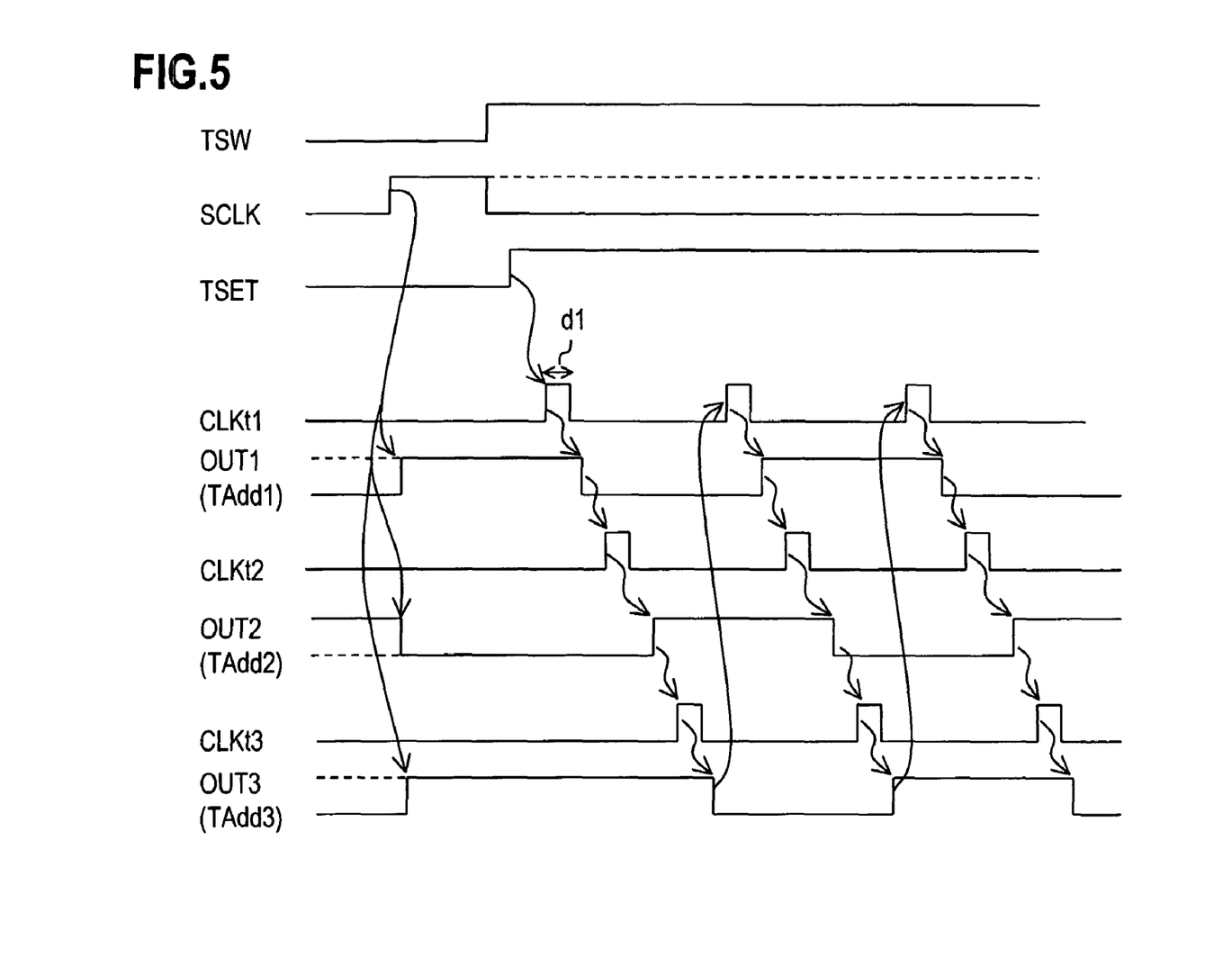
FIG. 5 is an operating waveform diagram showing operation of a ring oscillator during testing in an aspect.

FIG. 5 is an operating waveform diagram showing operation of a ring oscillator during testing in this embodiment. In the test circuit 22 shown in FIG. 2, prior to performing tests, H level and L level are written to a prescribed address in each RAM macro. As explained above, the relation between the prescribed address and the written data is such that H level data corresponds to the first address (TAdd=L level), and L level data corresponds to the second address (TAdd=H level). In a state in which the addresses for the RAM macro units RMU1, RMU2, RMU3 are respectively set to the first, second, and first addresses, when one system clock pulse SCLK is supplied, the data outputs OUT1=H, OUT2=L, OUT3=H are output from the respective RAM macro units. The above is the initialization operation.

Thereafter, the test control circuit 22 sets the test switching signal TSW to H level in response to a test signal TEST from external equipment, and configures a ring oscillator from the three RAM macro units. In this state, the test set signal TSET is at L level, and consequently the set circuit 24 is supplying H level to an input of the NAND gate 26. When the test control circuit 22 switches the test set signal TSET to H level, both the inputs to the NAND gate 26 become H level, the output switches from H level to L level, and the inverter 28 causes the input IN1 of the initial-stage RAM macro unit RMU1 to rise from L level to H level.

In response to this change in the input IN1, the pulse generation circuit 32 within the initial-stage RAM macro unit RMU1 generates a control pulse CLKt1. This control pulse CLKt1 is used as a trigger for the RAM macro 14 within the initial-stage RAM macro unit to capture the address Add, TAdd1 (=ADD) and start a read operation. Through the read operation, the data output OUT1 is switched from H level to L level after a prescribed access time.

This switching of the initial-stage unit data output OUT1 is supplied, as the input IN2, to the second-stage RAM macro unit RMU2, and the pulse generation circuit 32 within this RAM macro unit generates a control pulse CLKt2. With this control pulse CLKt2 as a trigger, the second-stage RAM macro 14 captures the L level address TAdd2 together with another address Add, performs a read operation, and switches the data output OUT2 to H level. The third-stage RAM macro unit RMU3 performs a similar operation, and the data output OUT3 is switched to L level.

Changes in the data output OUT3 of the final-stage RAM macro unit RMU3 are supplied to the input IN1 of the initial-stage unit RMU1 via the NAND gate 26 and inverter 28, and in response to changes in this input IN1, control pulses CLKt1 are generated, read operations are performed, and the data output OUT1 switches to H level. Following this, read operations are similarly performed in the second and third stages, and the data outputs OUT2, OUT3 also switch in order.

Through the above operation, a ring oscillator comprising three RAM macro unit stages undergoes oscillation. The test control circuit 22 extracts the data output OUT3 of the third-stage RAM macro unit RMU3, for example, and measures the oscillation frequency or period of the unit.

However, the ring oscillator comprises, in addition to the three RAM macros 14, a pulse generation circuit 32, NAND gate 26, and inverter 28. Hence it is necessary to exclude these delay times from the above measured period. Further, the input/output stage switches SWin and SWout within the RAM macro 14 can perform switching with almost no delay, through configuration using, for example, CMOS transfer gates or similar.

Figure 6A:
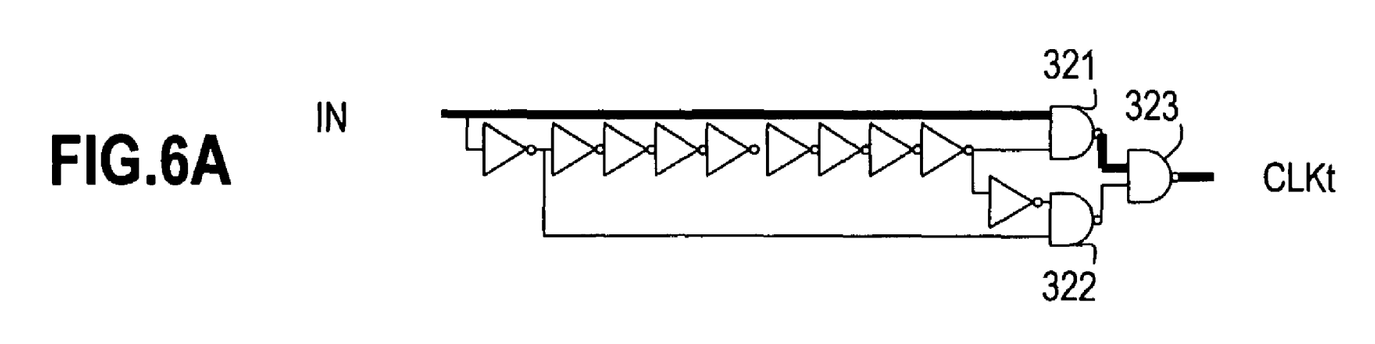
FIGS. 6A and 6B explain the delay time in a pulse generation circuit 32.
Figure 6B:
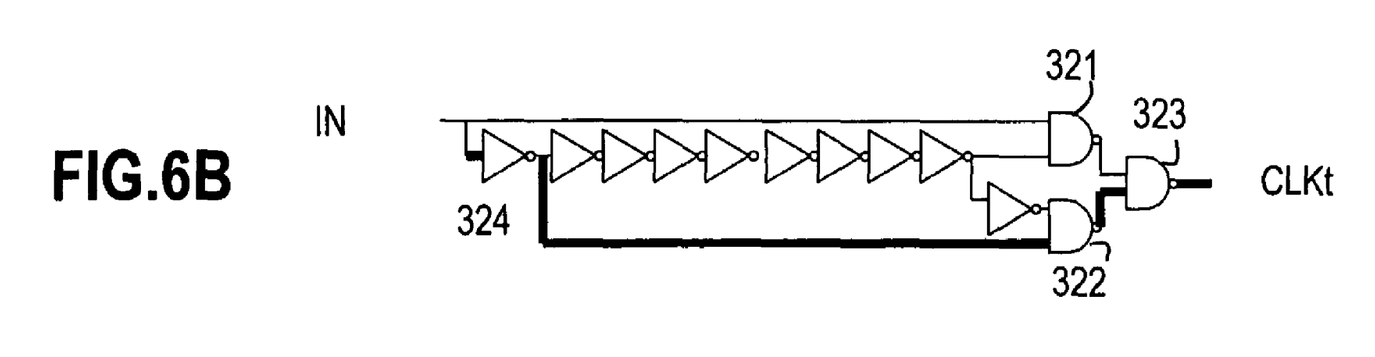

FIGS. 6A and 6B explain the time delay in the pulse generation circuit 32. As explained above, when in the pulse generation circuit 32 the input IN rises from L level to H level, a control pulse CLKt is generated in the channel of the NAND gates 321, 323 shown in FIG. 6A, and when the input IN falls from H level to L level, a control pulse CLKt is generated in the channel of the inverter 324 and NAND gates 322, 323 shown in FIG. 6B. Hence in a ring oscillator comprising the three macro unit stages shown in FIG. 2, in addition to the three RAM macros, the delay times of seven NAND gates and two or three inverters are also comprised by the oscillation period.

The test control circuit 22 may incorporate a ring oscillator using inverters and NAND gates, and the delay times may be determined from the periods of each, or delay time data for each may be provided in advance. In any case, the period of the ring oscillator comprising RAM macro units, excluding the above delay times, becomes the RAM macro access time.

The test control circuit 22, in addition to measuring the RAM macro access time, measures the limit at which oscillation of the ring oscillator stops during variable control of the pulse width of the control clock pulse CLKt. Or, the test control circuit 22 measures the limit value at which oscillation of the ring oscillator stops by variably controlling the timing of supply of the address TAdd, so as to variably control the setup time and hold time of the rising edge of the RAM macro control clock pulse CLKt.

In initialization operation for operation of the above ring oscillator, the data outputs OUT1, 2, 3 of the three RAM macro unit stages are set to H, L, and H levels respectively. However, the data outputs OUT1, 2, 3 may all be at H level, or may all be at L level. Or, any arbitrary combination may be used. The pulse generation circuits incorporated within each RAM macro unit generate control pulses CLKt in response to either the leading edges or to the trailing edges of input IN pulses, and so it is sufficient that the level changes each time the data output is accessed, and either switching direction is acceptable.

Pulse Width of Control Clock

Figure 7:
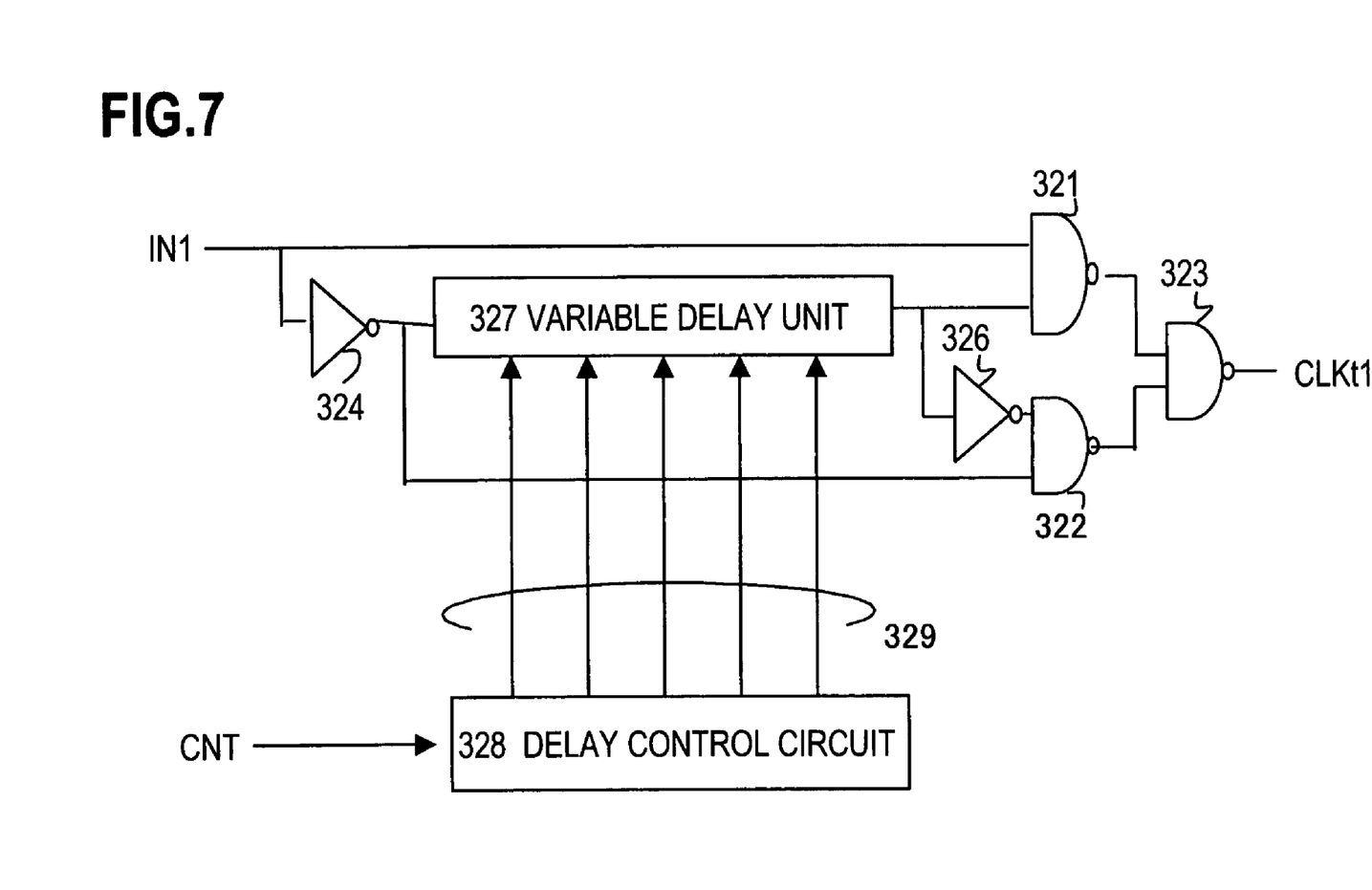
FIG. 7 shows a pulse generation circuit capable of variable control of the pulse width of a control clock.

FIG. 7 shows a pulse generation circuit capable of variable control of the pulse width of the control clock. The inverter series 325 of the pulse generation circuit shown in FIG. 4 has been replaced with a variable delay unit 327. And, a delay control circuit 328, which supplies a delay control signal 329 to the variable delay unit 327, is provided. The delay control circuit 328 executes variable control of the delay amount of the variable delay unit 327 by outputting a prescribed delay control signal 329 in response to a control signal CNT. Otherwise the configuration is the same as in FIG. 4.

The delay time of this inverter series corresponds to the pulse width of the control pulse CLKt. Hence by lengthening the delay amount of the variable control unit 327, the pulse width of the control pulse CLKt is made longer, and by shortening the delay amount of the variable control unit 327, the pulse width of the control pulse CLKt is made shorter.

Hence in this embodiment, of the three RAM macro unit stages in FIG. 2, the pulse generation circuit within the initial-stage RAM macro unit RMU1 is formed by the circuit in FIG. 7, and a pulse width control signal CNT to control the pulse width is output from the test control circuit 22. This pulse width control signal CNT can be controlled by a test control signal Tcnt from external equipment. During testing, as shown in FIG. 5, in a state in which the ring oscillator is made to oscillate, the pulse width of the control pulse CLKt1 within the initial-stage RAM macro unit RMU1 is variable controlled by the pulse width control signal CNT. That is, as shown in FIG. 5, the test control circuit 22 monitors whether the oscillation operation of the ring oscillator is maintained while the pulse width dl of the control pulse CLKt1 is gradually shortened or gradually lengthened.

The minimum pulse width of this control pulse is stipulated by RAM macro specifications, and by enabling variable control of the pulse width, it is possible to check at which range of pulse width dl the normal operation of the initial-stage RAM is possible according to whether the ring oscillator oscillation operation is maintained or not.

Setup Time

Figure 8:
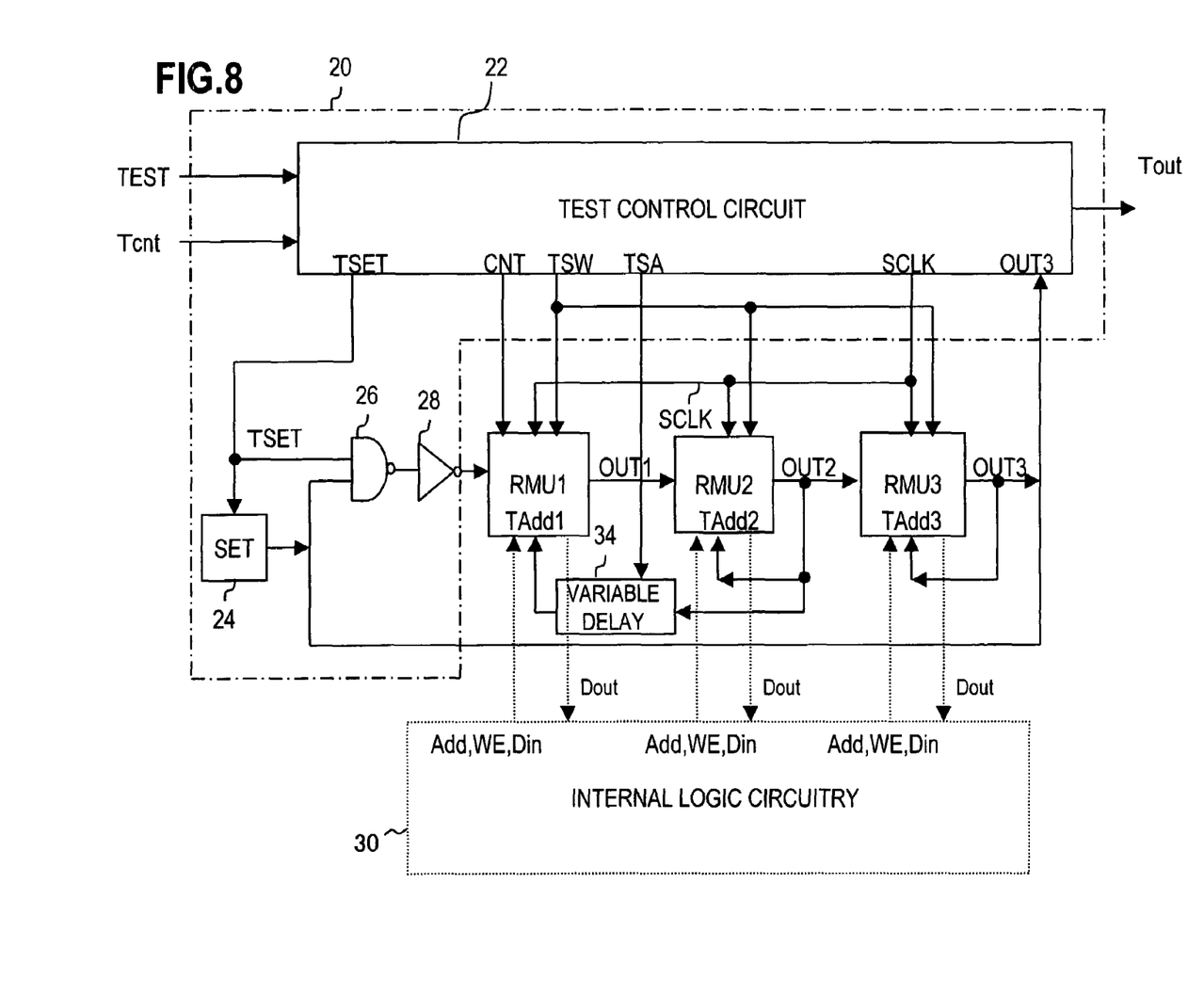
FIG. 8 shows a test circuit which measures the limit value of the setup time in an aspect.

FIG. 8 shows a test circuit which measures the limit value of the setup time in this embodiment. The RAM macro 14 shown in FIG. 3 captures and latches the address ADD in sync with the rising edge of the control clock CLK. Hence it is necessary to measure the extents of the limits for the setup time and hold time for the address ADD with respect to the control clock CLK. In the test circuit shown in FIG. 8, rather than the initial-stage data output OUT1, a signal obtained by delaying the second-stage data output OUT2 is provided as the address TAdd1 for testing of the initial-stage RAM macro unit RMU1. Further, the second-stage data output OUT2 is the inverted signal of the initial-stage data output OUT1, and so the result of inverting the second-stage data output OUT2 is provided as the initial-stage test address TAdd1. And, the setup time control signal TSA, which controls the delay amount of the variable delay circuit 34, is supplied to the variable delay circuit 34 from the test control circuit 22. Otherwise the configuration is the same as in FIG. 2.

Figure 9:
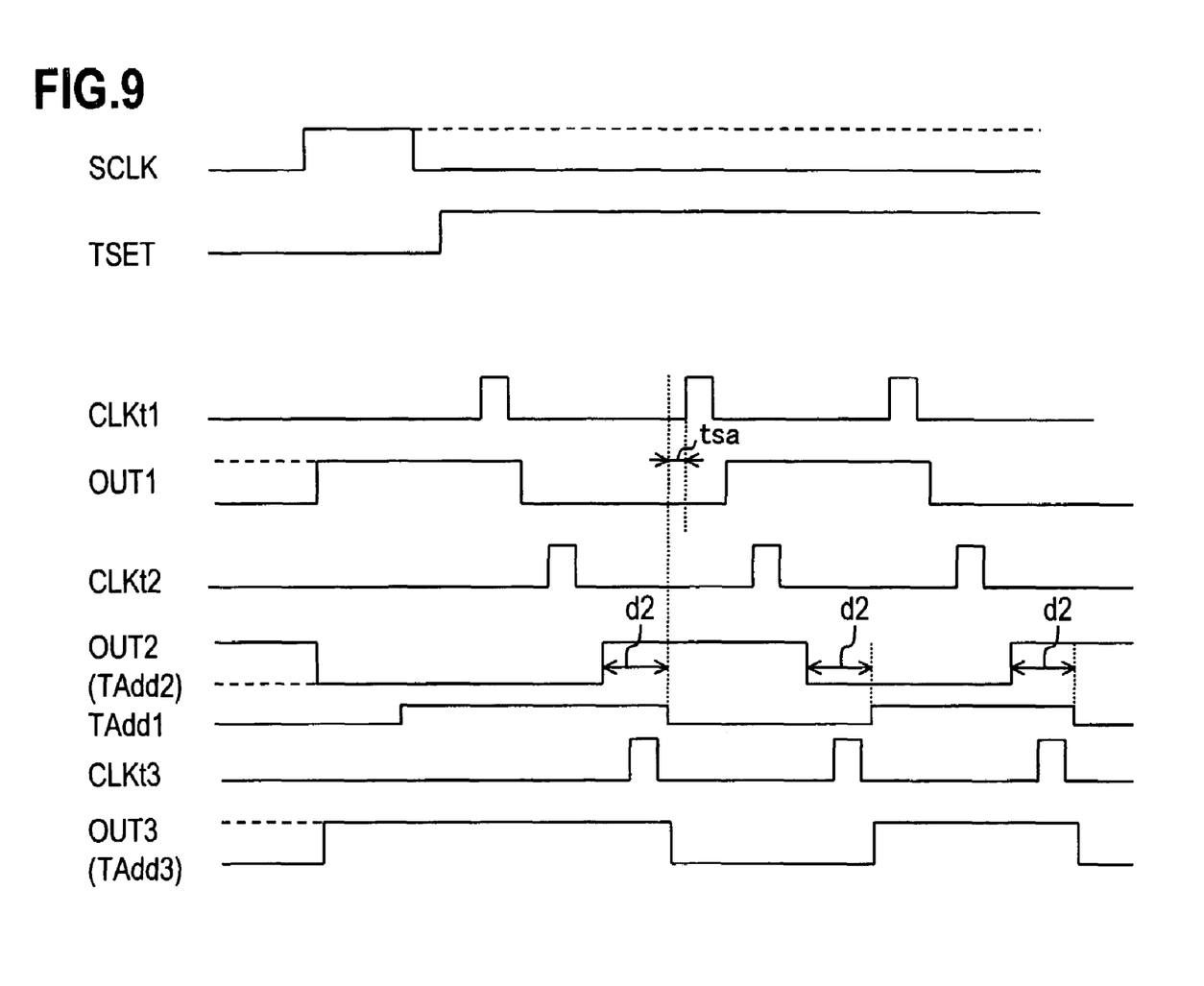
FIG. 9 is a waveform diagram showing test operation to measure the setup time.

FIG. 9 is a waveform diagram showing test operation to measure the setup time. Between the rising edge of the control pulse CLKt1 provided to the initial-stage RAM macro and the timing for switching the initial-stage data output OUT1, there is a time difference corresponding to the delay time due to the three-stage RAM macro units. Hence if the initial-stage data output OUT1 is adopted as the test address TAdd1, as shown in FIG. 2, then the setup time is too long. Therefore, in this embodiment the data output OUT2 of the second-stage RAM macro unit is delayed and inverted and is supplied as the initial-stage test address TAdd1.

As shown in FIG. 9, by inverting and delaying the second-stage data output OUT2 by a delay time d2 due to the variable delay circuit 34, the initial-stage test address TAdd1 is generated. Through variable control of the delay time d2, the setup time tsa, which is the time difference between the switching timing of the test address TAdd1 and the rising edge of the control clock CLKt1, can be variably controlled. Moreover, because the switching timing of the second-stage data output OUT2 is comparatively close to the rising edge of the control pulse CLKt1, the delay amount of the variable delay circuit 34 need not be made very large. It is also possible to delay the initial-stage and third-stage data outputs OUT1 and OUT3 for use as the initial-stage test address TAdd1; but in this case, the delay amount of the variable delay circuit must be made comparatively large, and the circuit scale becomes larger.

The test control circuit 22 variably controls the delay amount d2 of the variable delay circuit 34 through the setup time control signal TSA, variably controls the setup time tsa of the RAM macro 14 within the initial-stage RAM macro unit, and can perform monitoring to determine at what setup time the ring oscillator oscillation stops, to measure the limit value of the setup time. Hence this setup time control signal TSA can be set using a control signal Tcnt from an external tester device, and a test result signal Tout of the test control circuit 22 can be output to an external tester device to indicate whether the ring oscillator is oscillating. Or, the test control circuit 22 can automatically modify the delay amount d2, recording whether there is oscillation each time, and finally output the recorded results.

Hold Time

Figure 10:
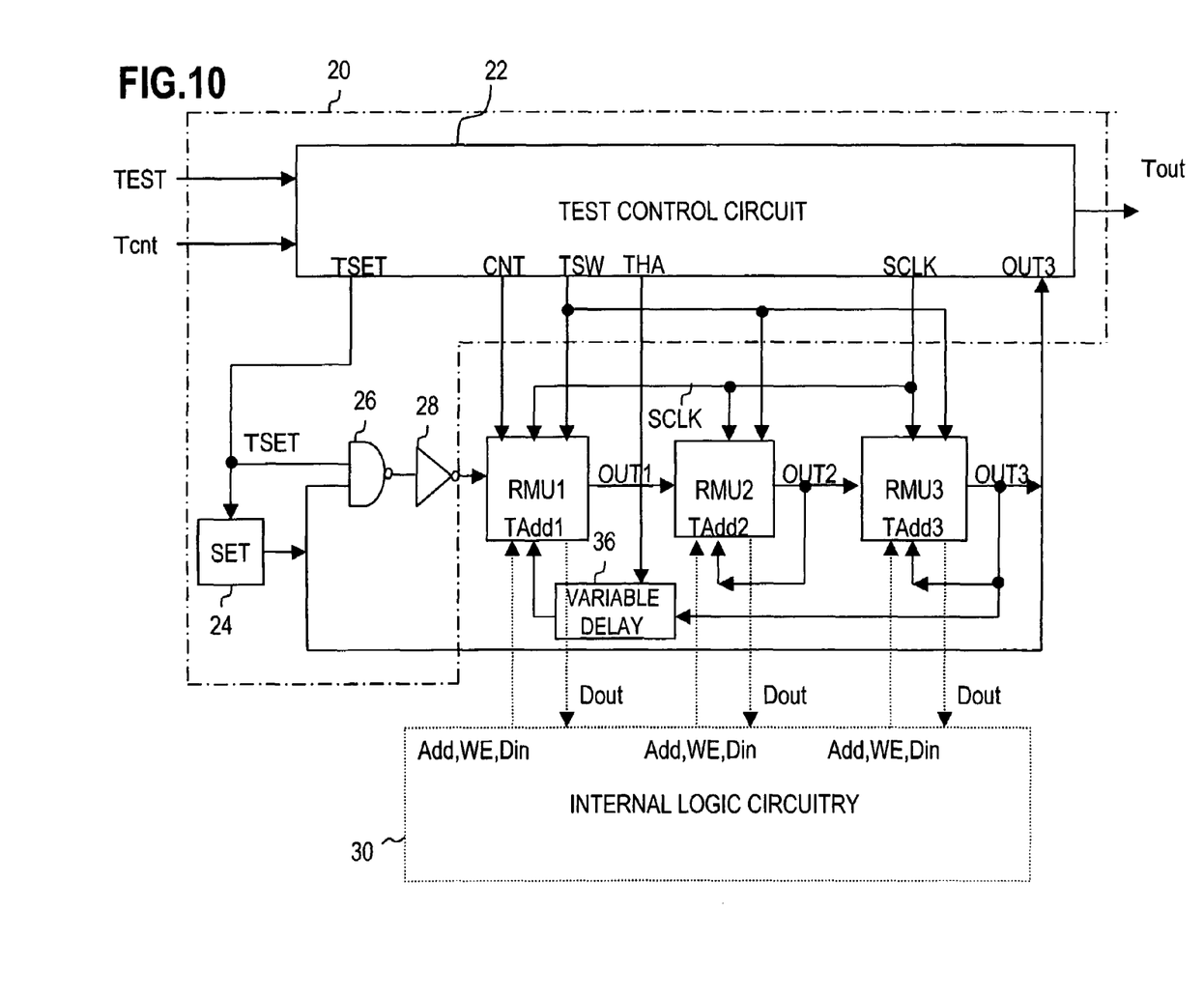
FIG. 10 shows a test circuit to measure the limit value of the hold time in an aspect.

FIG. 10 shows a test circuit to measure the limit value of the hold time in this embodiment. Differences from FIG. 2 are the fact that the data output OUT3 of the third stage, which is the prior stage, is delayed and supplied to the test address TAdd1 of the initial-stage RAM macro unit RMU1, and that the delay amount of the variable delay circuit 36 can be varied by a hold time control signal THA. The data output OUT3 of the third stage is delayed by about one period compared with the initial-stage data output OUT1, so that the data output OUT3 is inverted and delayed by the variable delay circuit 36 and supplied as the test address TAdd1. Otherwise the configuration is the same as in FIG. 2.

Figure 11:
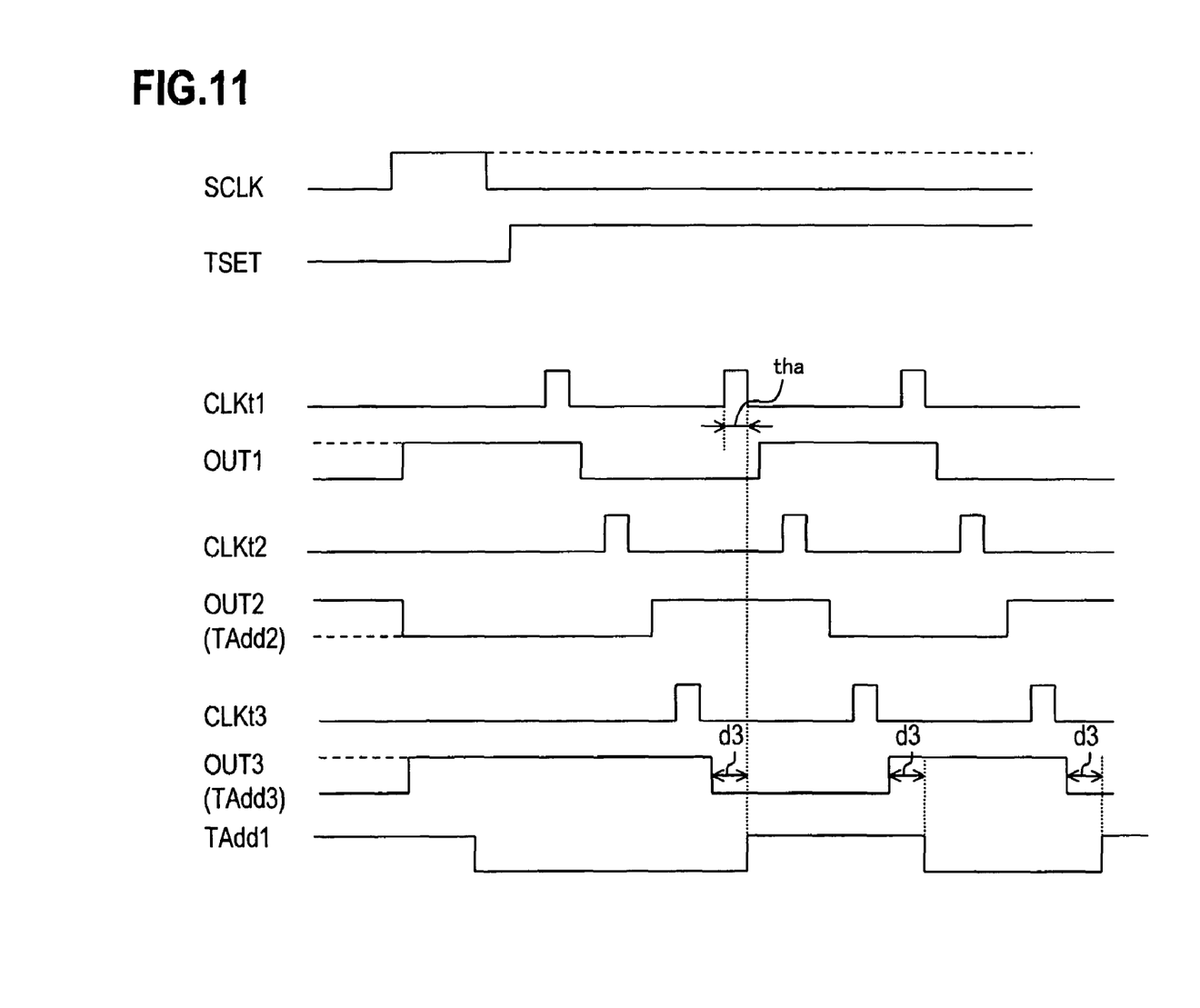
FIG. 11 is a waveform diagram showing test operation to measure the hold time.

FIG. 11 is a waveform diagram showing test operation to measure the hold time. The variable delay circuit 36 delays by a prescribed delay time d3 and also inverts the third-stage data output OUT3, and supplies the result as the test address signal TAdd1. The initial-stage control pulse CLKt1 is generated in response to changes in the third-stage data output OUT3, so that by delaying by a delay time d3 the third-stage data output OUT3, the test address signal TAdd1 can be changed at the hold time tha after the rising edge of the control pulse CLKt1. Through variable control of this delay time d3, variable control of the hold time tha with respect to the initial-stage control pulse CLKt1 is possible.

Hence in the state in which the ring oscillator is oscillating, the test control circuit 22 can detect the limit value of the hold time for stopping oscillation operation by gradually shortening the hold time tha.

As is seen from FIG. 11, variable control of the hold time is also possible even by delaying the second-stage data output OUT2 and providing to the initial-stage test address TAdd1. However, the delay amount must be made larger. In this case also it is necessary to invert the second-stage data output OUT2.

As explained-above, by delaying by a prescribed amount any of the oscillation clocks (or oscillation pulses) within the ring oscillator circuit, test address TAdd1 for the initial-stage RAM macro unit can be generated, and through variable control of this delay time, the limit value of the setup time and the limit value of the hold time can be detected. In the examples of FIG. 8 and FIG. 10 described above, the limit value of the setup time is measured using the test address TAdd1 resulting by delaying the second-stage data output OUT2, and the limit value of the hold time is measured using the test address TAdd1 resulting by delaying the third-stage data output OUT3. By providing both the variable delay circuits 34, 36 of FIG. 8 and FIG. 10, and using switching means to switch the delay signals thereof, the limit values of the setup time and of the hold time can be measured using a common test circuit.

In the above embodiment, the ring oscillator is configured using three RAM macro unit stages; but a ring oscillator can be configured using one or two stages. If writing is performed such that each RAM macro outputs the inverted signal of the test address as the data output, then each time the input IN to the RAM macro unit changes, the data output of the following-stage RAM macro unit also changes, and the ring oscillator can be made to oscillate.

Figure 12:
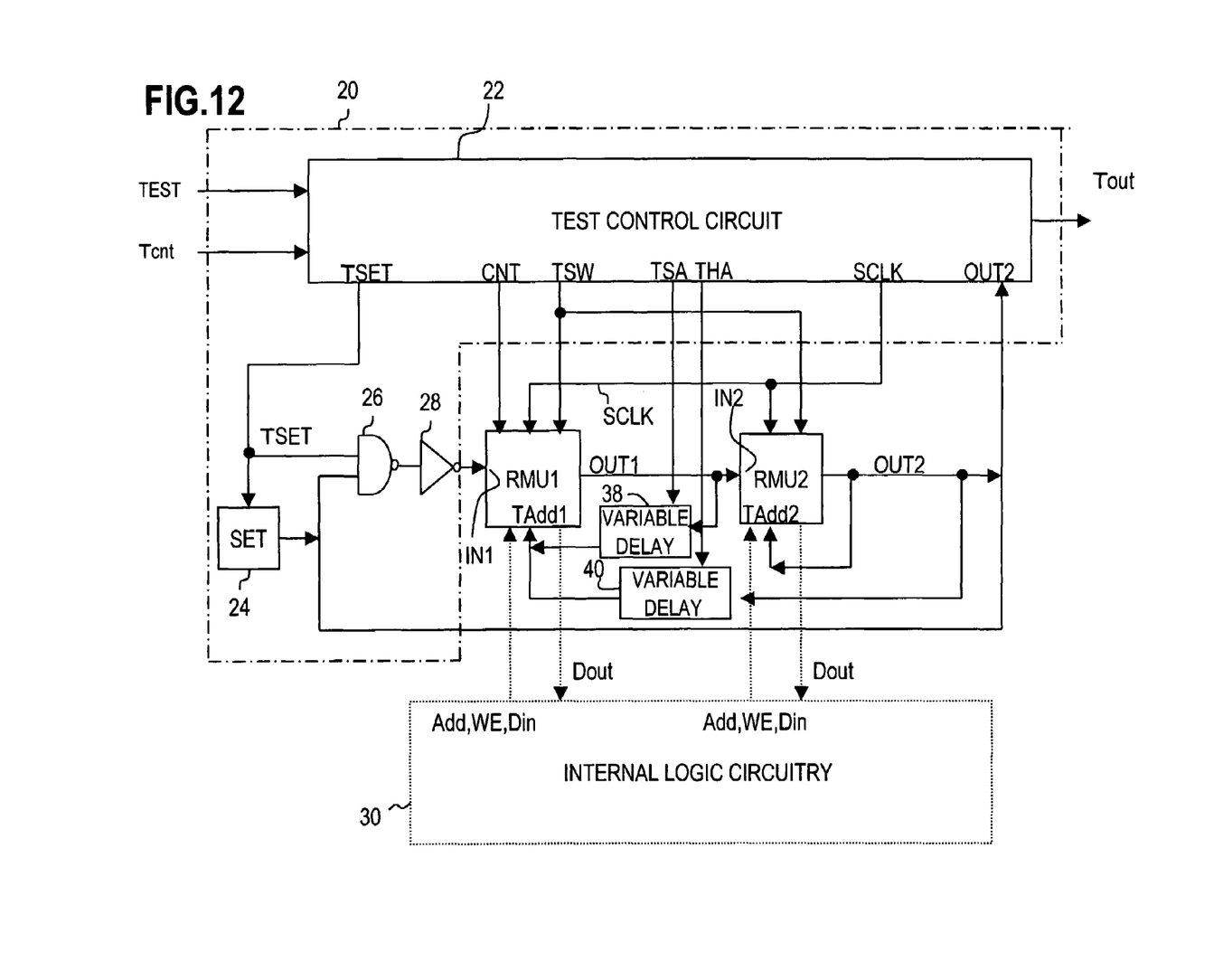
FIG. 12 shows a test circuit comprising two ring oscillator stages.

FIG. 12 shows a test circuit comprising two ring oscillator stages. A ring oscillator is configured from an initial-stage RAM macro unit RMU1, a second-stage RAM macro unit RMU2, a NAND gate 26, and an inverter 28. The oscillation operation of the ring oscillator is similar to that of FIG. 5. However, the oscillation period is the sum of the delay times of the two RAM macro unit stages RMU1, 2, the NAND gate 26, and the inverter 28; because the third-stage unit in the oscillation circuit of FIG. 2 is not present, the oscillation period is shorter by this amount.

In the example of FIG. 12, the test control circuit 22 supplies the pulse width control signal CNT to the initial-stage RAM macro unit RMU1 for the purpose of variable control of the pulse width of the control clock. Further, in order to measure the limit values of the setup time and hold time, a first variable delay circuit 38 to delay the initial-stage data output OUT1, and a second variable delay circuit 40 to delay the second-stage data output OUT2, are provided. And, the test control circuit 22 supplies a setup time control signal TSA and hold time control signal THA to these variable delay circuits 38 and 40 to perform variable control of the delay times and detect the respective limit values.

Figure 13:
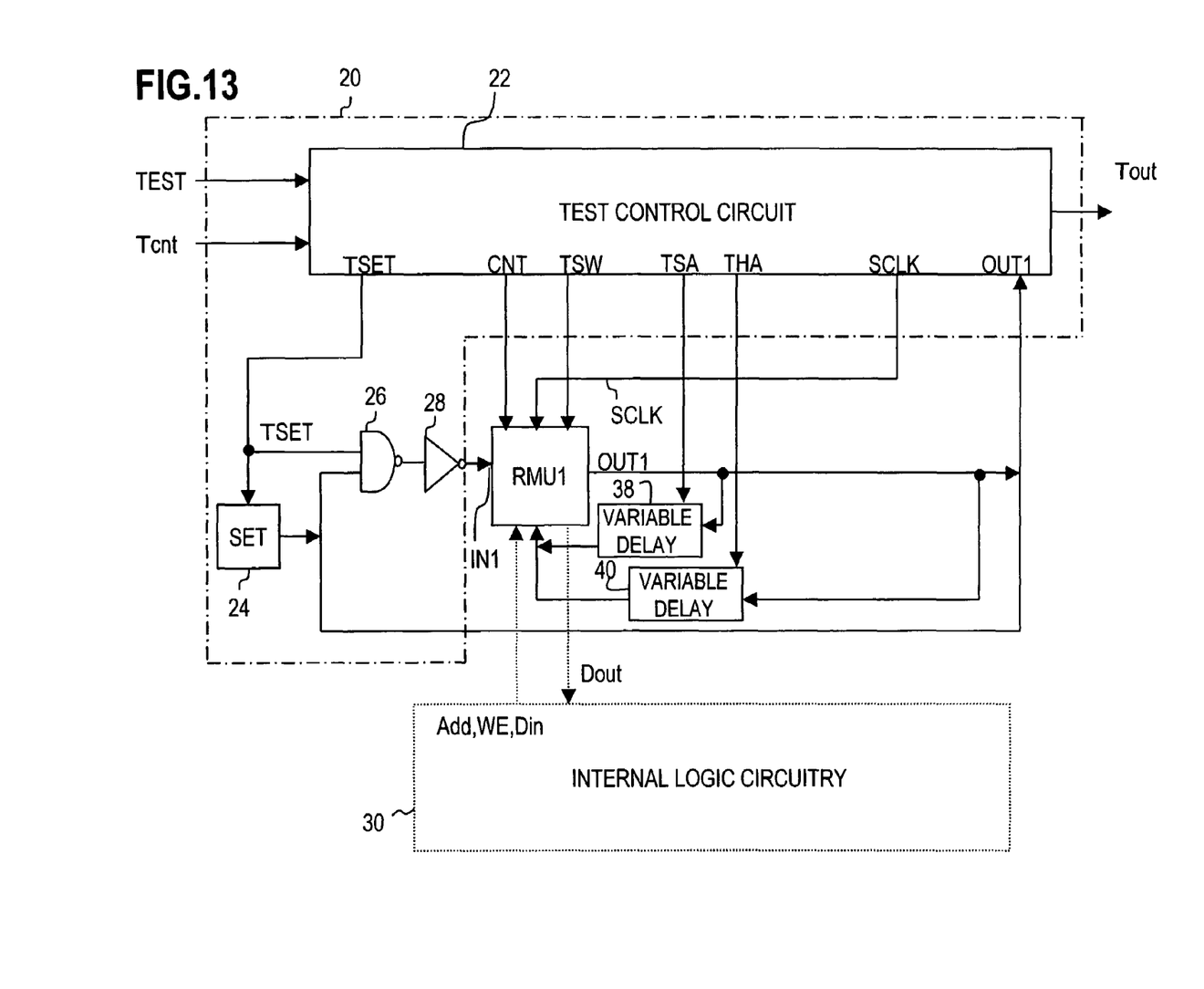
FIG. 13 shows a test circuit comprising one ring oscillator stage.

FIG. 13 shows a test circuit comprising one ring oscillator stage. In this example, the data output OUT1 of the RAM macro unit RMU1 passes through the NAND gate 26 and inverter 28 and is fed back to the input IN1. Oscillation operation is similar to that of FIG. 5. As a result, the oscillation period of this ring oscillator is the sum of the delay times of the RAM macro unit RMU1, the NAND gate 26, and the inverter 28. The pulse width of the pulse generation circuit within the RAM macro unit RMU1 is controlled by the pulse width control signal CNT from the test control circuit 22. In order to measure the limit values of the setup time and hold time, a first variable delay circuit 38 and second variable delay circuit 40 are provided, the respective delay times of which are controlled by the control signals TSA and THA from the test control circuit 22.

As explained above, according to this embodiment a RAM macro is connected to configure a ring oscillator, so that the RAM macro access time can be measured precisely without supplying a clock pulse from an external source. Further, so long as the RAM macro operates normally, oscillation operation of the ring oscillator can be utilized to easily measure the limit value of the control clock pulse width and the limit values of the setup time and hold time.

INDUSTRIAL APPLICABILITY

According to this invention, by providing a test circuit capable of precise measurement of the AC characteristics of RAM macros within an integrated circuit device, AC characteristic tests of RAM macros provided internally can be performed by the integrated circuit itself, so that the possibilities of utilization within the semiconductor industry and elsewhere is high.

The invention claimed is:

1. An integrated circuit device incorporating a memory macro, having:
    at least one memory macro, which outputs a data output signal in response to a supplied control pulse; and,
    a test circuit, which measures characteristics of the memory macro, wherein, the test circuit, during testing, configures a memory macro unit by a pulse generation circuit and the memory macro, said pulse generation circuit generating test control pulses in response to an input pulse, and said memory macro outputting, first or second data output signals, in alternation, in response to the test control pulses; and
    configures a ring oscillator by cascade-connecting memory macro units in a prescribed number of stages which is one or greater, with an output of the final-stage memory macro unit being fed back to an input of the initial-stage memory macro unit, the test circuit measuring the oscillation frequency or period of the ring oscillator.

2. The integrated circuit device according to claim 1, wherein, in the memory macros within the memory macro units, a first data is stored in a first address, a second data of polarity opposite the first data is stored in a second address, the data output signal is fed back as the input address to the memory macros, the input address becomes the second address through the first data feedback, and the input address becomes the first address through the second data feedback.

3. The integrated circuit device according to claim 1, wherein the test circuit measures the delay time from the supply of the input pulse to the pulse generation circuit to the occurrence of the test control pulse, and excludes the delay time of the pulse generation circuit from the oscillation frequency or period of the ring oscillator.

4. The integrated circuit device according to claim 1, wherein the pulse generation circuit generates the test control pulses in response to both the leading edge and the trailing edge of the input pulses.

5. The integrated circuit device according to claim 1, wherein the test circuit generates a pulse width control signal which controls the pulse width of the test control pulse, the pulse generation circuit outputs the test control pulse with the pulse width changed according to the pulse width control signal, and the test circuit detects whether the ring oscillator is oscillating.

6. The integrated circuit device according to claim 1, wherein the test circuit configures the ring oscillator by cascade-connecting at least first, second, and third memory macro units;
    the memory macro data output signal of the second memory macro unit is connected, via a variable delay circuit, to the address terminal of the memory macro within the first memory macro unit; and
    the test circuit variably controls the delay time of the variable delay circuit, and detects whether the ring oscillator is oscillating according to the variable control.

7. The integrated circuit device according to claim 1, wherein the test circuit configures the ring oscillator by cascade-connecting at least first, second, and third memory macro units;
    the data output signal of the RAM macro of the third memory macro unit is supplied, via a variable delay circuit, to the address terminal of the memory macro within the first memory macro unit; and
    the test circuit variably controls the delay time of the variable delay circuit, and detects whether the ring oscillator is oscillating according to the variable control.

8. The integrated circuit device according to claim 1, wherein the test circuit configures the ring oscillator by cascade-connecting at least first, second, and third memory macro units;
    the data output signal of the memory macro of the second memory macro unit is provided, via a first variable delay circuit, and the data output signal of the memory macro of the third memory macro unit is provided, via a second variable delay circuit, respectively to the address terminal of the memory macro within the first memory macro unit; and
    the test circuit variably controls the delay time of the first or the second variable delay circuit, and detects whether the ring oscillator is oscillating according to the variable control.

9. The integrated circuit device according to claim 1, wherein the test circuit configures the ring oscillator by cascade-connecting at least first and second memory macro units;
    the data output signal of the memory macro of the second memory macro unit is supplied, via a variable delay circuit, to the address terminal of the memory macro within the first memory macro unit; and
    the test circuit variably controls the delay time of the variable delay circuit, and detects whether the ring oscillator is oscillating according to the variable control.

10. The integrated circuit device according to claim 1, wherein the test circuit configures the ring oscillator by connecting the output of a first memory macro unit to the input of the first memory macro unit;

the data output signal of the memory macro of the first memory macro unit is supplied, via a variable delay circuit, to the address terminal of the memory macro within the first memory macro unit; and the test circuit variably controls the delay time of the variable delay circuit, and detects whether the ring oscillator is oscillating according to the variable control.

11. An integrated circuit device incorporating a memory macro, having:
   an internal memory macro which, during normal operation, latches an input address in response to a control pulse, and generates data output corresponding to the input address;
   a test control circuit which, during testing, performs characteristic tests of the memory macro; and
   a variable delay circuit which delays a clock pulse oscillated by the ring oscillator and supplies the delayed clock pulse as a test address to any of the memory macro units, wherein the test control circuit, while variably controlling the delay amount of the variable delay circuit, monitors the oscillation or oscillation stoppage of the ring oscillator, and wherein
   memory macro units respectively having the memory macro and a pulse generation circuit which during testing generates test control pulses in response to an input pulse are connected in a prescribed number of one or more stages to configure a ring oscillator, and the test control circuit measures the oscillation frequency or period of the ring oscillator.

12. The integrated circuit device according to claim 11, wherein the test control circuit variably controls the pulse width of the pulse generation circuit, and monitors the oscillation or oscillation stoppage of the ring oscillator.

13. An integrated circuit device incorporating a plurality of memory macros, comprising:
   a plurality of memory macro units each including a memory macro and a pulse generation circuit;
   wherein, during testing, the plurality of memory macro units configure a ring oscillator comprising the plurality of memory macro units coupled with cascade-connecting respectively and a feedback line where an output of a final-stage memory macro unit is fed back to an input of a initial-stage memory macro unit; and
   a test circuit measuring an oscillation frequency or period of the ring oscillator;
   wherein each pulse generation circuit generates a test control pulse in response to an input signal, any one of the plurality of memory macro units, in response to the input signal, outputs an output pulse including a first level and a second level, which alternatively appear to the test circuit.

14. The integrated circuit device according to claim 13, wherein an output pulses in which the final-stage memory macro unit output is inputted as the input signal to the pulse generation circuit in the initial-stage memory macro unit.

15. The integrated circuit device according to claim 13, wherein the test circuit comprises a delay-measurement unit measuring a delay time between one point of providing the input signal to the pulse generation circuit and the other point of generating the test control pulses, and eliminates the delay time from the oscillation frequency or period of the ring oscillator.

16. The integrated circuit device according to claim 13, wherein the test circuit generates a pulse width control signal controlling pulse widths of the test control pulses and detects existence or nonexistence of oscillation of the ring oscillator, the pulse generation circuit outputs the control pulses with rectification in response to the pulse width control signal.

17. The integrated circuit device according to claim 13, wherein the pulse generation circuit generates the test control pulses in response to each of forward edges and backward edges of the input signal.

18. An integrated circuit device incorporating a plurality of memory macros, comprising:
   a plurality of memory macro units each including a memory macro and a pulse generation circuit;
   wherein, during testing, the plurality of memory macro units configure a ring oscillator comprising the plurality of memory macro units coupled with cascade-connecting respectively and a feedback line where an output of a final-stage memory macro unit is fed back to an input of a initial-stage memory macro unit; and
   wherein the ring oscillator comprises at least a first memory macro unit, a second memory macro unit and a third memory macro unit which are coupled with cascade-connecting respectively, output pulses of a memory macro of the second memory macro unit are provided to an address terminal of a memory macro of the first memory macro unit through a variable delay circuit between the first memory macro unit and the second memory macro unit, the test circuit detects existence or nonexistence of oscillation of the ring oscillator in response to variable control based on variable controlled delay time in accordance with the variable delay circuit.

* * * * *